United States Patent [19]

Fleischman et al.

[11] Patent Number: 5,317,190
[45] Date of Patent: May 31, 1994

[54] OXYGEN ASSISTED OHMIC CONTACT FORMATION TO N-TYPE GALLIUM ARSENIDE

[75] Inventors: Aaron J. Fleischman, Teaneck, N.J.; Naftali E. Lustig, Croton-on-Hudson; Robert G. Schad, Yorktown Heights, both of N.Y.

[73] Assignee: International Business Machines Corporation, Armonk, N.Y.

[21] Appl. No.: 782,683

[22] Filed: Oct. 25, 1991

[51] Int. Cl.5 .......................................... H01L 29/400
[52] U.S. Cl. .................................... 257/743; 257/745; 257/763; 257/766
[58] Field of Search ............................... 257/741-745, 257/750, 763, 766, 770

[56] References Cited

U.S. PATENT DOCUMENTS

| | | |
|---|---|---|
| 3,930,975 | 1/1976 | Siegle et al. ............... 204/192 |
| 3,983,264 | 9/1976 | Schroen et al. ............ 427/39 |
| 4,188,710 | 2/1980 | Davey et al. ............... 29/580 |
| 4,994,892 | 2/1991 | Zuleeg et al. .............. 357/67 |
| 4,998,158 | 3/1991 | Johnson et al. ............ 357/71 |

OTHER PUBLICATIONS

A. Piotrowska et al. "Ohmic Contacts to III–V Compound Semiconductors" *Thin Solid Films*, vol. 193/194, No. 1/2 Dec. 1, 1990, Lausanne CH, pp. 511–527.

Patent Abstracts of Japan, vol. 4, No. 137 (E-027) Sep. 25, 1980 & JP-A-55 088 371 (Sanyo Electric Co. Ltd.) Jul. 4, 1980.

Kuriyama et al., Effects of Oxygen Impurities in W Films on W/GaAs Schottky-Barrier contacts, Journal of Applied Physics, vol. 66 No. 6, Sep. 15, 1989, pp. 2446–2454.

A New GaAs Technology for Stable FET's at 300° C. Fricke et al., IEEE Elec. Dev. Let. Dec. 1989, pp. 577–579.

Low Au Content NiGe (au) W Contacts to GaAs Lustig et al., Appl. Phys. Lett. 58(19), May 13, 1991, pp. 2093–2095.

*Primary Examiner*—Rolf Hille
*Assistant Examiner*—Peter Toby Brown
*Attorney, Agent, or Firm*—Blaney Harper; David Aker

[57] ABSTRACT

This invention describes a low resistance contact structure to n-type GaAs and a method for making such a contact structure. The contact structure is formed by depositing successive layers of Ni, Au, Ge, and Ni. A fifth layer is then deposited on the first four layers. The fifth layer is a metallic tungsten oxide. The metallic tungsten oxide is formed by sputtering tungsten onto the 4 layer stack in a low pressure argon plus oxygen atmosphere. The resulting 5 layer stack is then annealed in a rapid thermal anneal (RTA) process. The RTA process heats the stack for 5 seconds at 600 degrees. The resulting structure consists of an intermetallic NiGe compound having a small amount of a AuGa compound dispersed within it and being covered by a metallic tungsten oxide film. The oxygen from the metallic tungsten oxide film acts as a gettering mechanism to create gallium vacancies in the GaAs lattice structure during the RTA process. The oxygen forms a compound with gallium which is sandwiched between the metallic tungsten layer and the NiGe metallurgy. The sheet resistance of the contact metallurgy is low because the metallic tungsten oxide film is substantially thicker than that required to provide oxygen for the gettering process. The contact resistance to the n-type GaAs is low because the oxygen acts in a similar fashion to gold and creates more gallium vacancies in the GaAs. These vacancies are filled with an n-type dopant (Ge), supplied by the contact metallurgy, to create a better ohmic contact. The contact structure is reliable because there is a low gold content in the contact and because the nickel stabilizes the germanium which is not used for filling the gallium vacancies in the GaAs lattice.

10 Claims, 5 Drawing Sheets

$$J \sim \exp\left(\frac{-2\Phi A}{\sqrt{N_D}}\right)$$

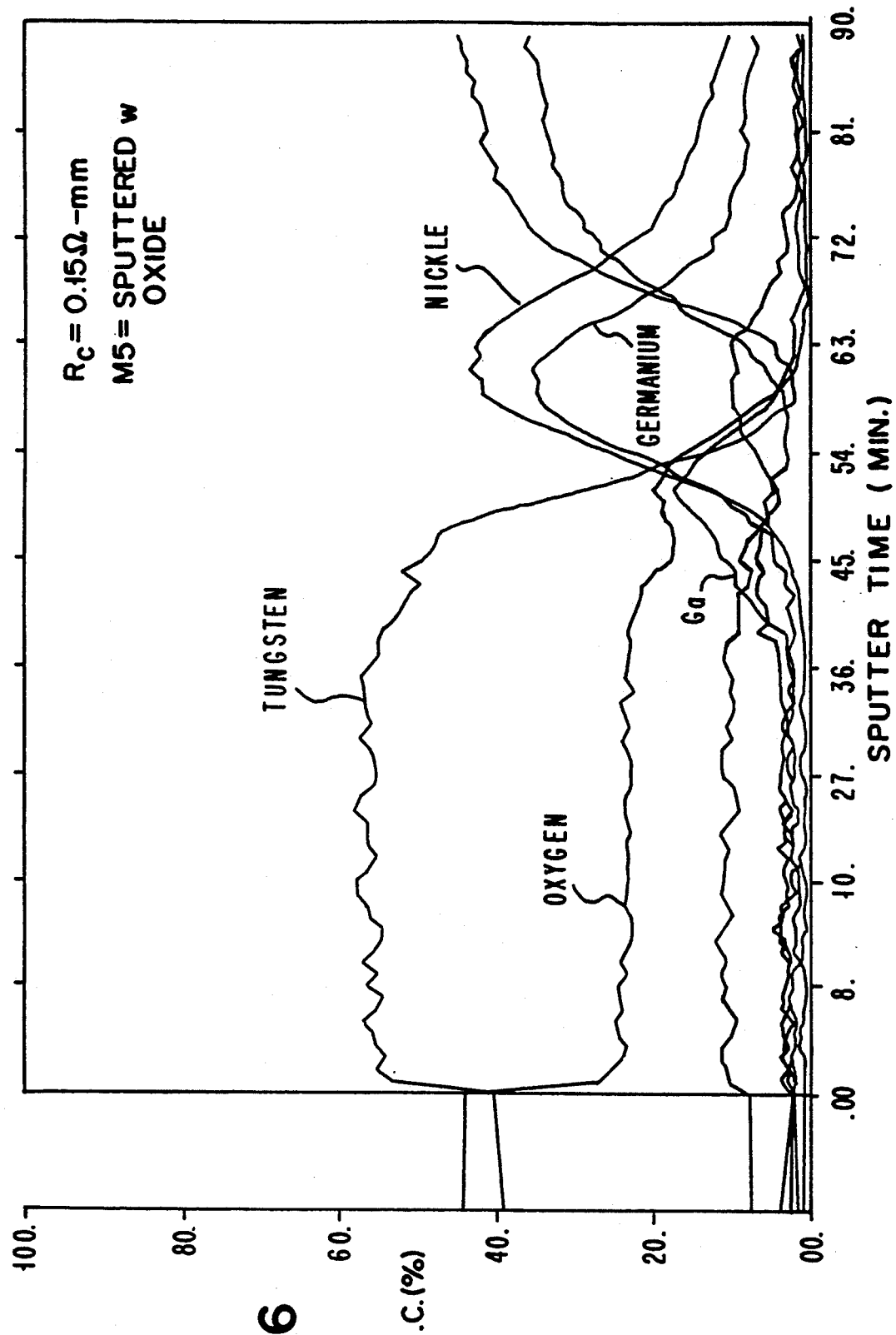

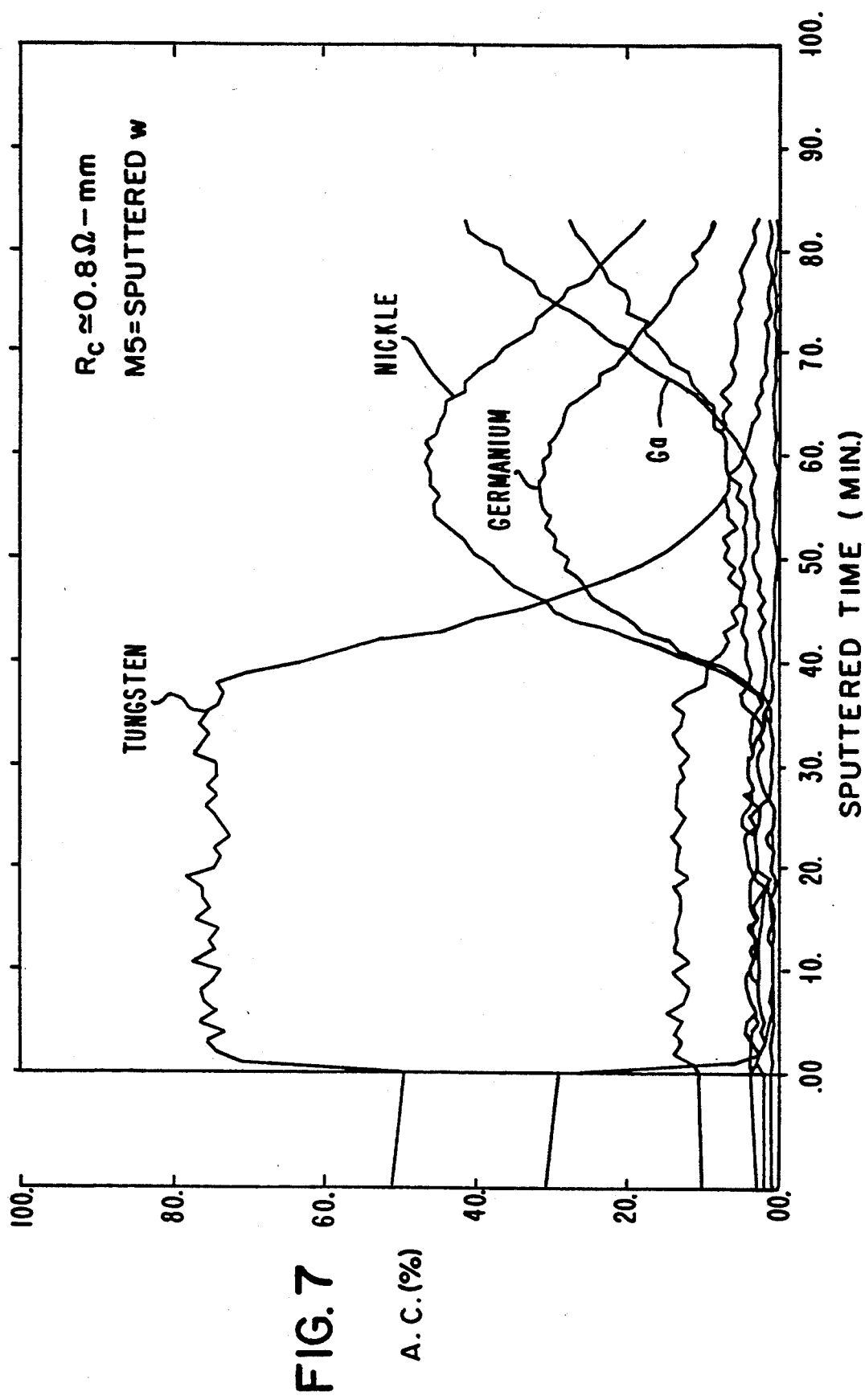

OXYGEN ASSISTED OHMIC CONTACT FORMATION TO N-TYPE GALLIUM ARSENIDE

FIELD OF THE INVENTION

This invention relates to metal/semiconductor contact structures and to methods for manufacturing such structures. More particularly, the invention relates to metal/semiconductor contact structures to n-type gallium arsenide. Specifically, the invention discloses the use of metallic tungsten oxide in conjunction with a low gold content nickel germanium metallurgy, to obtain a low resistance thermally stable ohmic contact to n-type gallium arsenide.

BACKGROUND OF THE INVENTION

Electrical devices built from gallium arsenic (GaAs) offer many advantages over conventionally built silicon semiconductor devices. In particular, gallium arsenide devices operate at higher speeds than silicon devices. This is due to the fact that electrons have a higher mobility in gallium arsenide than in silicon. However, the speed advantage inherent in gallium arsenide cannot be realized unless the electrical signals produced by the individual devices can be transmitted to other devices. Gallium arsenide devices, like silicon devices, must be connected to other devices without impairing the signal transmission between devices. Therefore, transmission of signals to and from the devices requires high quality contacts. This is a particular problem for gallium arsenide because contacts are not as easily made to gallium arsenide devices as they are to silicon devices. Therefore, unless high quality contacts can be made to gallium arsenide, the speed advantage of gallium arsenide over silicon will not be realized.

The electrical quality of the contact to the gallium arsenide device is measured by the resistance (called contact resistance) between the gallium arsenide semiconductor and the contact metallization. If the current flow through the contact is linear with the applied voltage across the contact and the resistance (V=IR) is low, the contact is said to be a good ohmic contact. Typically, the various gallium arsenide devices are interconnected during circuit fabrication by aluminum alloy wiring, although other types of metals can be used. However, merely depositing the aluminum (or most other metals) directly onto the gallium arsenide creates a Schottky diode rather than an ohmic contact. This diode can be made into an ohmic contact to n-type GaAs by doping the GaAs with an n-type dopant. Specifically, the dopant concentration in the GaAs must be in excess of approximately 1E19 per cubic centimeter to create an ohmic contact. This level of doping creates enough tunnelling current through the diode potential barrier that the diode behaves electrically like an ohmic contact. The problem with this solution to GaAs n-type contacts is that conventional doping and annealing techniques of GaAs are not sufficient to dope GaAs to such high levels. Therefore, in order to create an ohmic contact to GaAs, the metallurgy itself must supply the necessary dopants.

Prior art attempts to solve the problem of GaAs contact resistance have generally included a germanium-gold (Ge-Au) alloy layer interposed between the n-type gallium arsenide and the wiring metallurgy. This multi-element alloy is employed to facilitate the incorporation of a dopant into the GaAs lattice. A commonly used ohmic contact to GaAs is based on the eutectic germanium-gold (Ge-Au) alloy (88 weight % Au), in conjunction with nickel (Ni). The compound is typically annealed above the eutectic temperature of approximately 360 degrees Celsius which results in the alloy being melted. The gold is highly reactive with Ga from the GaAs lattice and forms Au-Ga compounds during the annealing process. This leaves Ga vacancies in the GaAs lattice which are occupied by Ge, an n-type dopant. This n-type dopant contributes to the tunnelling current and helps form an ohmic contact even though the doping concentration without the contact metallurgy is less than 1E19/cubic centimeter. The problem with this solution to the contact problem is that, in addition to having low resistance, contacts must be thermally stable. Device processing after the contact formation includes multilevel interconnect processing and packaging. These steps can expose the GaAs device to temperatures of approximately 400 degrees Celcius for periods of a few minutes to several hours. Heating the eutectic based Ge-Au-Ni contacts to 400 degrees after contact formation results in local melting of the contact which raises the contact resistance. In addition to the contact resistance being raised generally, the variance in contact resistance between devices on a chip is also raised. This is because the melting of the contact metallurgy does not occur uniformly across the chip. Therefore, the eutectic based Ge-Au-Ni contact is not a solution to the GaAs contact resistance problem because the processes after the contact formation degrade the Ge-Au-Ni compound contact resistance. Another prior art attempt to produce a reliable contact structure to gallium arsenide comprises a plurality of layers of different metals. Specifically, the contact structure includes a first layer of nickel covered by a thin layer of gold followed by a Ge-Ni layer and a tungsten (W) layer. The gold content in the annealed NiGe(Au)W compound is low compared to the eutectic Ge-Au-Ni compound. The NiGe(Au)W compound is more thermally stable than the eutectic Ge-Au-Ni compound and it still retains enhanced contact resistance. The tungsten is added in order to reduce the sheet resistance of the low Au content alloy. The resulting contact structure is characterized by a low contact resistance which has high thermal stability, smooth morphology and a uniform metal to gallium arsenide interface. These characteristics are essential for providing the improved reliability of the metal to gallium arsenide contact structure. The problem with this particular contact structure, however, is that tungsten has a very high melting point. Therefore, evaporating tungsten onto gallium arsenide is incompatible with VLSI processing of high performance gallium arsenide devices. Furthermore, conventional sputtering of the tungsten onto the identical nickel/germanium/gold layered structure results in contacts with poor contact resistance. Sputtering the tungsten, rather than evaporating it, defeats the purpose of the contact structure.

OBJECTS OF THE INVENTION

It is an object of the present invention to manufacture a contact to gallium arsenide.

It is a further object of the present invention to manufacture a contact to gallium arsenide having a low contact resistance.

It is still another object of the present invention to manufacture a contact to gallium arsenide having low contact resistance variance.

It is still a further object of the present invention to manufacture a contact to gallium arsenide having high reliability.

It is still another object of the present invention to manufacture a contact to gallium arsenide having thermal stability.

It is still a further object of the present invention to manufacture a contact to gallium arsenide which is compatible with VLSI processing of high speed devices.

SUMMARY OF THE INVENTION

This invention describes a low resistance contact structure to n-type GaAs and a method for making such a contact structure. The contact structure is formed by depositing successive layers of Ni, Au, Ge, and Ni. A fifth layer is then deposited on the first four layers. The fifth layer is a metallic tungsten oxide. The metallic tungsten oxide is formed by sputtering tungsten onto the 4 layer stack in a low pressure argon plus oxygen atmosphere. The resulting 5 layer stack is then annealed in a rapid thermal anneal (RTA) process. The RTA process heats the stack for 5 seconds at 600 degrees. The resulting structure consists of an intermetallic NiGe compound having a small amount of a AuGa compound dispersed within it and being covered by a metallic tungsten oxide film. The oxygen from the metallic tungsten oxide film acts as a gettering mechanism to create gallium vacancies in the GaAs lattice structure during the RTA process. The oxygen forms a compound with gallium which is sandwiched between the metallic tungsten layer and the NiGe metallurgy. The sheet resistance of the contact metallurgy is low because the metallic tungsten oxide film is substantially thicker than that required to provide oxygen for the gettering process. The contact resistance to the n-type GaAs is low because the oxygen acts in a similar fashion to gold and creates more gallium vacancies in the GaAs. These vacancies are filled with an n-type dopant (Ge), supplied by the contact metallurgy, to create a better ohmic contact. The contact structure is reliable because there is a low gold content in the contact and because the nickel stabilizes the germanium which is not used for filling the gallium vacancies in the GaAs lattice.

BRIEF DESCRIPTION OF THE DRAWINGS

FIG. 6 illustrates the gallium and oxygen content of the present invention as a function of depth into the contact stucture.

FIG. 7 illustrates the gallium and oxygen content of a prior art contact structure as a function of depth into the contact structure.

DESCRIPTION OF THE PREFERRED EMBODIMENT

Figure 1:
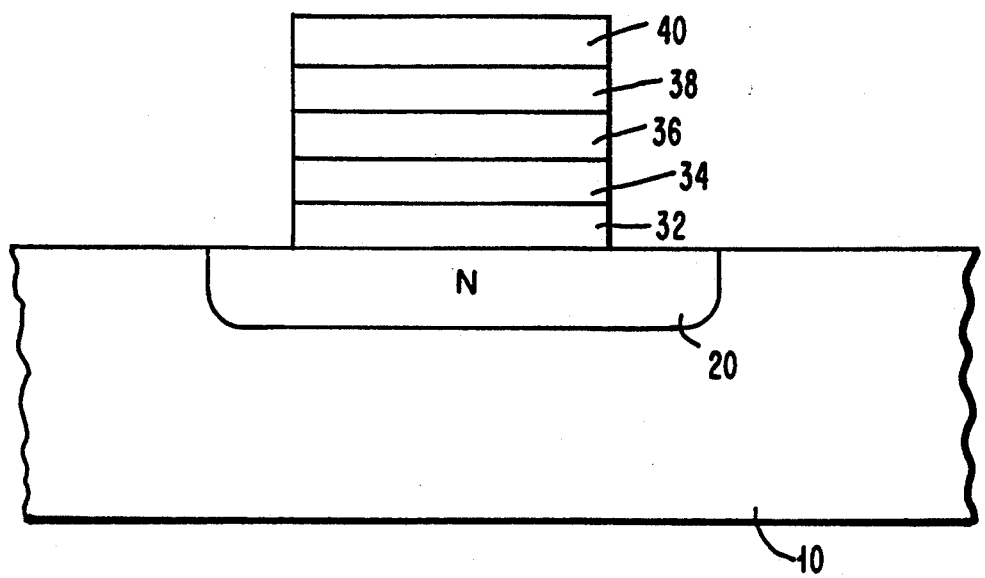
FIG. 1 illustrates the contact structure of the present invention before the RTA process step.

FIG. 1 illustrates the contact structure of the present invention. The gallium arsenide substrate 10 has a donor doped impurity region 20. The contact to the donor doped impurity region is deposited as a five layer structure. The first layer 32 is a nickel layer. The second layer 34 is a gold layer. The third layer 36 is a germanium layer. The fourth layer 38 is a nickel layer. The fifth layer 40 is crucial to the contact resistance between the gallium arsenide and the contact metallization. The fifth layer 40 is a metallic tungsten oxide rather than a pure tungsten film. Once the five layers have been individually deposited, the contact structure is thermally annealed. The anneal forms a metal alloy 25 (FIG. 5) covered by the metallic tungsten oxide film 40. Aluminum wiring 42 is then deposited on the contact structure to complete the interconnection of the GaAs device to other devices as is later explained with respect to FIG. 5.

Figure 2:
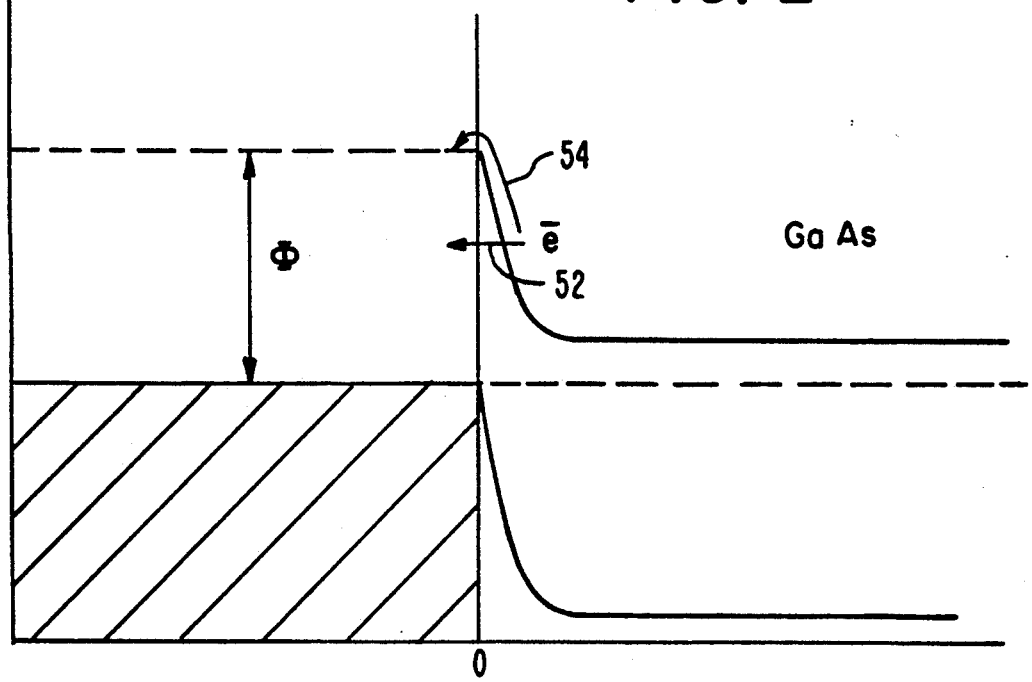
FIG. 2 illustrates the energy band relationship of the present invention.

FIG. 2 illustrates a theoretical energy band structure for the present invention with respect to the depth (X) of the contact structure. The Fermi level (Ef) in the GaAs lattice is equal in energy (electron volts) to the Fermi level of the metal alloy contacting the GaAs at the interface between the metal alloy and the GaAs at thermal equilibrium. Phi is the barrier height at the metal alloy/GaAs interface. The conduction band energy Ec equals the Fermi level plus the barrier height. The conduction band energy in the GaAs away from the metal/GaAs interface is equal to that of the bulk conduction band energy in GaAs. Also, heavy doping in the N++ region makes the GaAs degenerate so that the Fermi level is above the conduction band in the N++ region. The conduction band energy Ec minus the valance band energy Ev in GaAs must always be constant. As a result, the valance band energy follows the conduction band energy with respect to depth in the GaAs. FIG. 2 illustrates how the conduction and valance band energy levels bend upward in energy near the metal/GaAs interface due to the above constraints. This bending of the energy bands creates an energy wall 50 which is thin enough in the depth direction (X) that electrons can tunnel through it as shown at 52, as opposed to gaining enough energy to go over the energy wall as shown at 54. The theoretical current density Jt which results from electrons tunnelling through the energy bands is shown in FIG. 2. This current density from the tunnelling electrons increases exponentially with the square root of the donor doping concentration Nd in the GaAs.

In order to create the tunnelling of electrons between the contact metallurgy and the n-type GaAs, gallium vacancies must be created in the GaAs lattice structure and filled with an n-type donor element. The vacancies in the GaAs lattice structure are created by annealing gold over the GaAs semiconductor. The vacancies are filled by annealing gold and GaAs in the presence of an n-type dopant element (with respect to the III-V GaAs lattice structure) such as germanium. Further, the gold/germanium/GaAs reaction is better controlled by using a first layer of nickel, which has a thickness of approximately 50 Angstroms. The first nickel layer facilitates the Au-Ga reaction by penetrating through a native oxide which may be present on the GaAs surface. This penetration improves the lateral uniformity of the AuGa reaction. The gold layer thickness is approximately 60 Angstroms. A germanium layer of approximately 275 Angstroms covers the gold layer, and is in turn, covered by a second nickel layer of approximately 125 Angstroms. The second nickel layer acts to provide thermal stability to the resulting contact by reacting with the Ge atoms which do not diffuse into the GaAs. The melting point of this intermetallic NiGe compound is approximately 750 degrees Celsius which is in excess of any subsequent processing temperatures. Finally, the thin gold layer is placed below the germanium layer, as opposed to over the germanium layer, to improve the gettering of the gallium from the GaAs lattice.

The thickness of the first nickel layer in the contact structure may range from approximately 0–50 Angstroms. The thickness of the gold layer may range from approximately 40–60 Angstoms. The thickness of the germanium layer in combination with the second nickel layer is adjusted so as to form the NiGe compound. As deposited, the combined separate layers have a thickness of 400 Angstroms with 275 Angstroms being Ge and 125 Angstroms being Ni. The total NiGe layer may be much thicker or thinner as long as the ratio of the Ge to Ni thickness remains approximately 2.2 to 1. After the deposition of the Ni/Au/Ge/Ni layers, they are subsequently covered with a fifth layer and then annealed. The annealing step is carried out by a rapid thermal anneal process (RTA). The RTA process ramps up the temperature of the anneal at approximately 100 degrees per second. The heating is done by a quartz lamp bank in an argon atmosphere. The equipment for the process is well known and commercially available. The anneal is done at 600 degrees (Celsius) for approximately 5 to 30 seconds. The proper anneal can be accomplished at different temperatures for different times. In particular, a different NiGe layer thickness from the preferred 275 Angstroms Ge plus 125 Angstroms Ni will require an adjustment in the anneal conditions with thicker films requiring longer anneal times.

The fifth layer of material which covers the Ni/Au/Ge/Ni layers is particularly critical to this invention. This is because the fifth layer also helps to getter gallium from the GaAs lattice as a complement to the gold which is already in the metal alloy. While gold is useful as a gettering agent, a large amount of gold (such as in the eutectic based contacts) in the contact degrades the reliability of the contact. Further, adding gold to the present contact metallurgy beyond a minimum amount does not substantially increase the gettering of the gallium from the GaAs lattice. The fifth layer is important because it adds oxygen to the contact metallurgy without creating a detrimental oxide. Adding oxygen to the metallurgy is important because oxygen acts like gold in that it getters gallium from the GaAs lattice when the contact structure is annealed, but unlike gold it does not degrade the contact under thermal stress. The oxygen getters gallium which is in addition to that gettered by the gold. Therefore, more vacancies in the GaAs lattice structure are created which leads to more doping of the GaAs lattice which, in turn, lowers the contact resistance to the GaAs.

Figure 3:
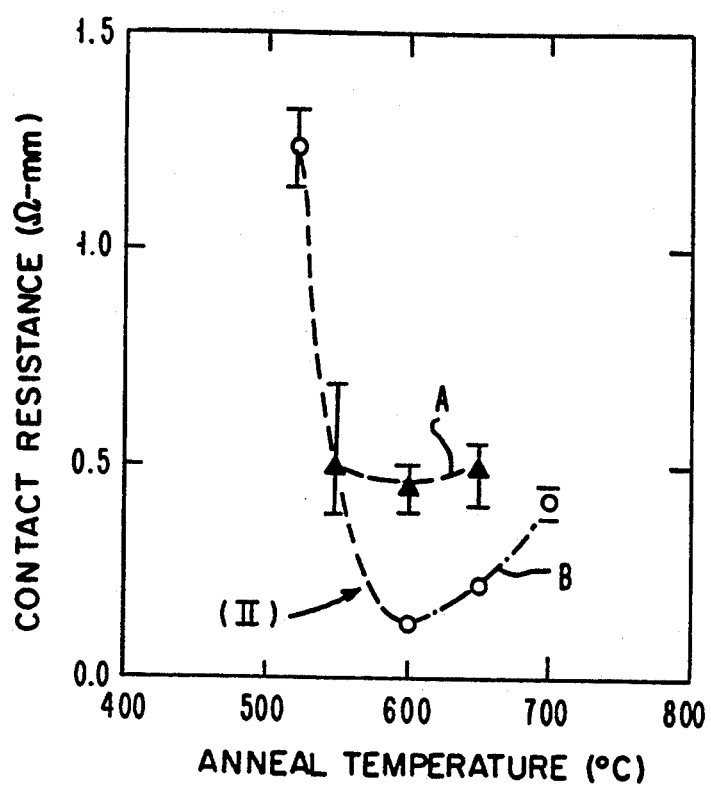
FIG. 3 illustrates the contact resistance of the present invention as a function of anneal temperature.

The fifth layer is a reactively sputtered metallic tungsten oxide film. The fifth layer is $W_xO$, where x is between approximately 2.5 and 9, preferably 4. The tungsten is a mixture of beta tungsten (A-15 structure) and an amorphous phase of tungsten which are both stabilized by oxygen. The tungsten film is reactively sputtered onto the Ni/Au/Ge/Ni layers in an atmosphere having a mixture of an inert gas and oxygen. The inert gas is typically argon but may also be Xenon, Krypton, or Neon. The oxygen is mixed with the Argon in a controlled fashion. The oxygen reacts with the sputtered tungsten to form a metallic tungsten oxide ($W_xO$) film. Sputtering pure tungsten is a well known process and is carried out at room temperature. As a result, the sputtering technique is well suited for high performance GaAs device fabrication. The added oxygen content in the sputtered tungsten is low enough so that the sheet resistance of the film is low, yet high enough to lower the contact resistance. FIG. 3 illustrates the effect (on contact resistance) of introducing oxygen into the tungsten fifth layer of the GaAs contact structure.

FIG. 3 plots the average contact resistance to n-type GaAs regions as a function of anneal temperatures for different contact structures. Plot A represents the contact resistance for sputtered tungsten in an argon only atmosphere. Plot B represents the same parameter for sputtered tungsten in an argon plus oxygen atmosphere. A comparison between the two plots shows not only that the average minimum contact resistance has decreased by a factor of 3 (from 0.45 to 0.15 ohm-mm), but that the data spread in contact resistance has also substantially decreased. Both of these improvements are important for VLSI GaAs applications. This is because decreasing the contact resistance increases the speed of device and associated circuitry. Additionally, many circuits depend on close device parameter tracking in order to generate the correct signals. Decreasing the contact resistance spread improves the device parameter tracking, and therefore, the ability to generate the proper electrical signals.

Figure 4:
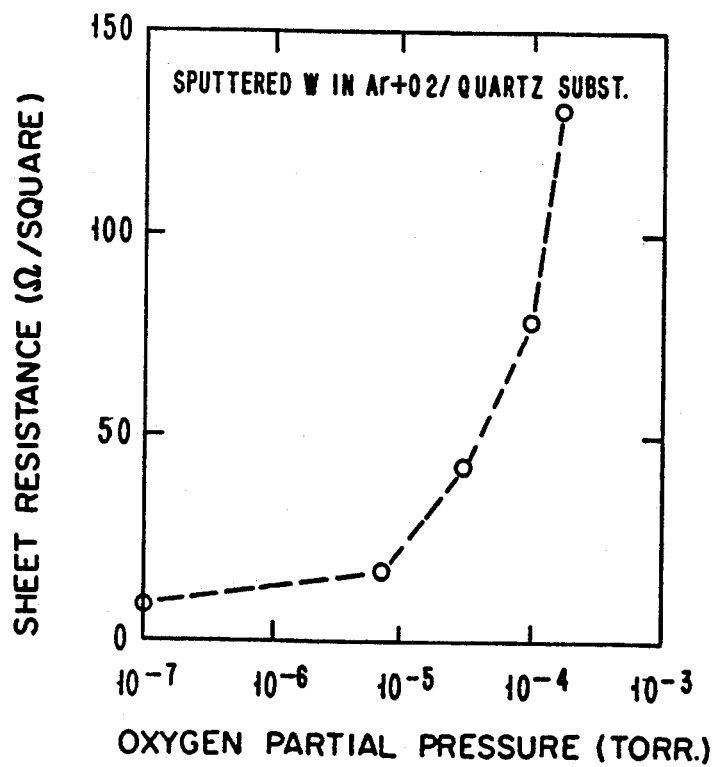
FIG. 4 illustrates the sheet resistance of sputtered tungsten oxide as a function of oxygen partial pressure.

The metallic tungsten oxide film as deposited is approximately 500 to 1000 Angstroms thick. The thickness of the film controls the sheet resistance of the contact. FIG. 4 illustrates the sheet resistance of the $W_xO$ as a function of the oxygen ($O_2$) partial pressure in the sputtering process for a 1000 Angstroms thick film on quartz substrates. The partial pressure of oxygen used in curve B of FIG. 3 was 1.5 E-4 in 1E-3 Torr of argon. The ratio between oxygen and argon gas pressures will vary when different sputtering techniques or deposition geometries are employed. However, adjusting the oxygen partial pressure with respect to the argon pressure to produce $W_xO$ films with a sheet resistance of between approximately 50 to 175 ohms per square, preferably 135 ohms per square for a 1,000 Angstrom thick film, yields the proper oxygen level in the tungsten layer. Controlling the sheet resistance of the metallic oxide film is an easier and more accurate method of forming the $W_xO$ film than determining the correct oxygen flow from physical analysis of individual deposition systems. Once the metallic tungsten oxide layer has been deposited on the Ni/Au/Ge/Ni layers, the five layer structure is subjected to the RTA process.

Figure 5:
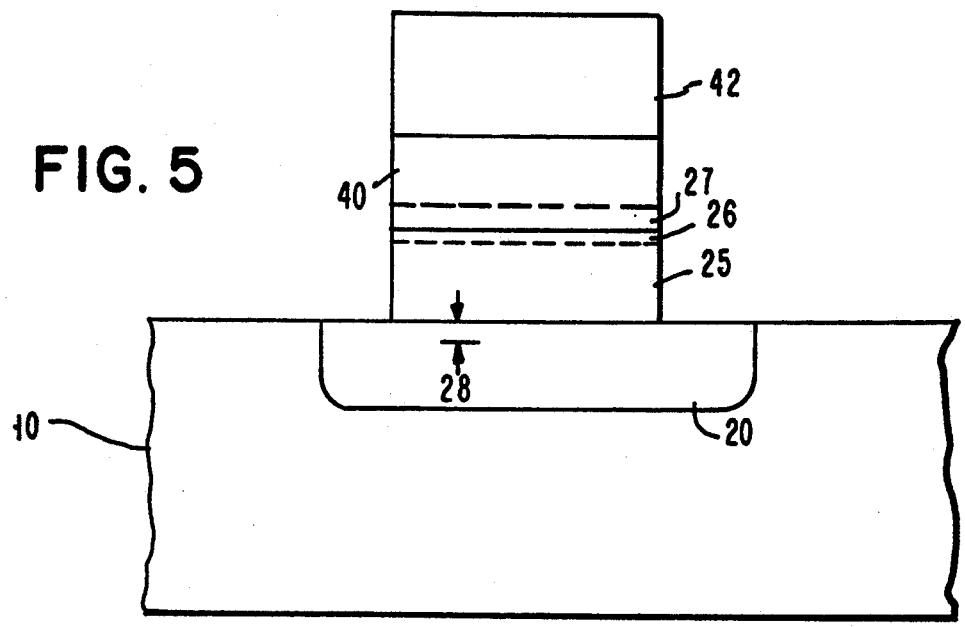
FIG. 5 illustrates the structure of the present invention after the RTA process step.

FIG. 5 illustrates the contact structure after it has been annealed. The first annealed layer 25 is composed of NiGe having a small amount of AuGa within it. The amount of AuGa in the NiGe layer is less than 1% of the AuGa found in annealed eutectic-based Au-Ge-Ni contacts. The second layer is the metallic tungsten oxide layer 40 which is depleted of oxygen in its lower portion 27 (adjacent the first layer 25). The lower portion of the metallic tungsten oxide layer 27 which is depleted of oxygen has a thickness of approximately 50–100 Angstroms. The oxygen which has outdiffused from layer 40 has reacted with Ga to create a thin discontinuous $Ga_2O_3$ layer 26 within the first annealed layer 25. The $Ga_2O_3$ compound may be found as close as 300 Angstroms from the GaAs surface. Additionally, the first annealed layer 25 has penetrated into the GaAs substrate. The amount of penetration 28 from the surface of the GaAs is less than 500 Angstroms. The aluminum alloy wiring metallurgy 42 is then deposited onto the annealed contact structure in a conventional manner.

The process of creating a metallic tungsten oxide film can be accomplished in several different ways. For example, it can be performed in a plasma enhanced chemical vapor deposition (PECVD) system with a 13.56 MHz plasma generated in a mixture of $WF_6$, $O_2$, and $H_2$. Additionally, the metallic tungsten oxide film need not have a uniform composition throughout. The important limitation is that there be enough oxygen in the lower portion 27 of the $W_xO$ film so that the contact resistance is reduced through the formation of a gallium oxide compound. The composition of the metallic tungsten oxide film above the lower portion 27 of the film can have much less or no oxygen in it. That is, pure tungsten can be the material above the lower portion of the $W_xO$ film and the contact resistance will still be effectively reduced.

Figure 8:
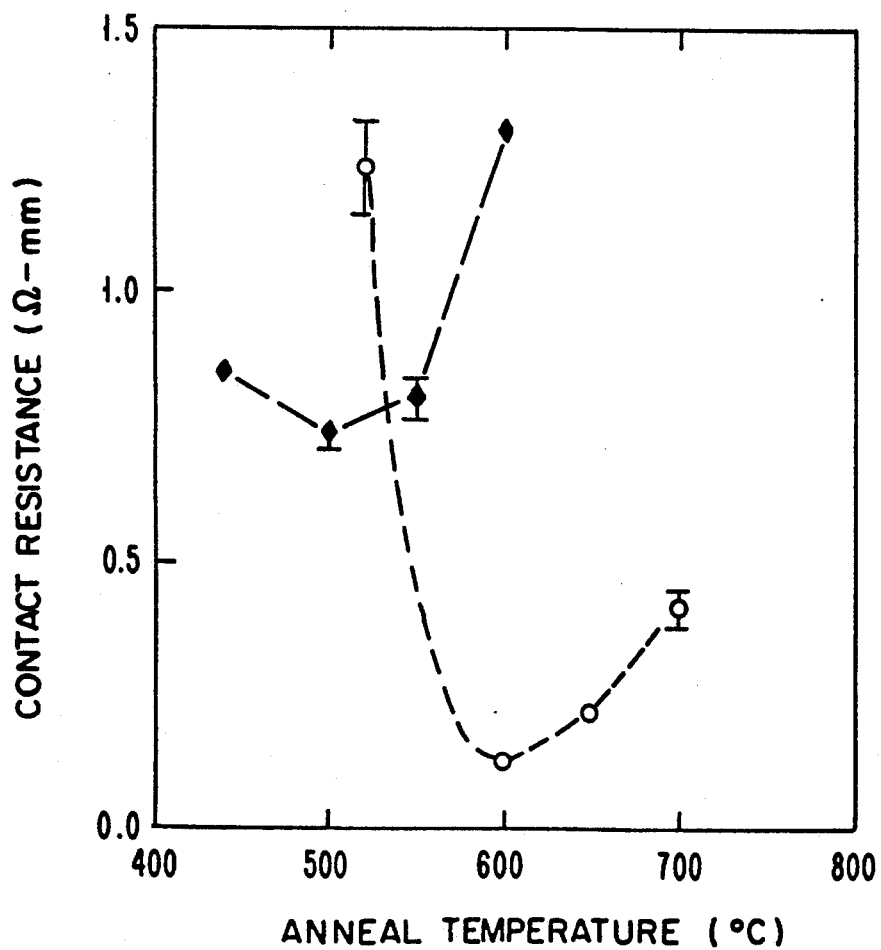
FIG. 8 illustrates the contact resistance of the present invention as a function of anneal temperature in comparison to a non-gettering tungsten alloy.

The fact that introducing oxygen into the metallurgy promotes gettering of gallium is illustrated in FIGS. 6-8. FIG. 6 is an Auger analysis, after annealing, of the contact structure having a metallic tungsten oxide fifth layer. FIG. 7 is the same analysis of a contact structure having only sputtered tungsten as a fifth layer. Finally, FIG. 8 illustrates the effect of substituting other elements for oxygen in the fifth layer. FIG. 6 illustrates that the oxygen content for the $W_xO$ metal alloy sputtered in the argon plus oxygen atmosphere is approximately 25%, whereas FIG. 7 shows that the oxygen content for the W metal alloy sputtered in argon is less than 1%. The increased oxygen content in the $W_xO$ layer is expected. However, FIG. 6 also shows that, near the metal alloy/semiconductor interface, there is a gallium peak which coincides with an oxygen peak. This shows that a gallium-oxygen compound is forming near the metal alloy/semiconductor interface. That is, the gallium is being gettered out of the GaAs lattice structure by oxygen diffusing out from the $W_xO$ film and forming a $Gu_2O_3$ compound. The sheet resistance of the $W_xO$ film is not affected by the outdiffusion of oxygen because only a small thickness, approximately 50-100 Angstroms, is depleted of oxygen during the anneal. FIG. 7 illustrates that when there is very little oxygen in the structure, the gallium does not substantially outdiffuse. Therefore, oxygen is the element which promotes the increased outdiffusion of gallium. The outdiffusion of gallium as a result of the introduction of oxygen and its effect on contact resistance is not an expected effect. Further, FIG. 8 illustrates the contact resistance of separate contact structures as a function of anneal temperature for a $W_xO$ fifth layer compared to a tungsten nitride ($W_xN$) compound used a fifth layer. Again, the $W_xO$ layer has a low contact resistance when compared with the alloy using tungsten nitride as a fifth layer. Nitrogen is not as reactive with gallium as is oxygen regardless of the anneal temperature and the contact resistance of the tungsten nitride structure is not reduced to the level of the metallic tungsten oxide structure. Therefore, nitrogen does not getter the Ga from the GaAs lattice and is not a replacement for oxygen in the contact structure.

Although the oxygen cannot be replaced by nitrogen in the contact structure to GaAs, substitutions for other elements in the contact structure can be made. Specifically, silicon (Si) could be substituted for germanium. This would provide for a Ni-Si-Au-Ni metal stack on which the $W_xO$ is deposited. When five layer stack is annealed, the silicon would occupy the lattice sites left empty by the gallium outdiffusion due to the oxygen. Also, palladium (Pd) could be substituted for the nickel layers. Palladium penetrates through any native oxide on the GaAs surface and is thermally stable in a compound with germanium or silicon. Finally, nickel oxide could replace metallic tungsten oxide as the source of the oxygen in the metallurgy system. Nickel has a low resistance and forms a suitable oxide compound for sputtering on the four layer stack. When nickel oxide is the source for the oxygen in the contact structure, it may be possible to reduce the thickness of the nickel layer separating the germanium (or silicon as the case may be) from the nickel oxide layer. When the types of layers are modified as described above, the thicknesses of those layers may also have to be modified as well as the anneal temperatures. However, these modifications will be well understood by those skilled in the art.

While this invention has been particularly described and illustrated with references to particular embodiments thereof, it will be understood by those skilled in the art that changes in the above description or illustrations may be made with respect to former or detail without departing from the spirit or scope of the invention.

Having thus described our invention what we claim as new and desire to secure as Letters Patent, is:

1. A contact to gallium arsenide comprising:
   a first metal alloy layer having a gallium compound and including gold, a thermally stable element, and a dopant element,
   said first metal alloy layer contacting said gallium arsenide;
   a second layer consisting essentially of a metal element chosen from a group consisting of tungsten or nickel and oxygen;
   said first metal alloy layer interposed between said gallium arsenide and said second layer; and
   a third layer interposed between said first and second layers, said third layer consisting essentially of a gallium oxide compound.

2. A contact to gallium arsenide, as in claim 1 wherein:
   said second layer contains 10 to 30 atomic percent oxygen.

3. A contact to gallium arsenide, as in claim 1 wherein:
   said thermally stable element is chosen from the group consisting of palladium or nickel, and
   said dopant element is chosen from the group consisting of germanium or silicon.

4. A contact to gallium arsenide, as in claim 3 wherein:
   said first layer comprises nickel, germanium, and gold.

5. A contact to gallium arsenide, as in claim 4 wherein:
   said second layer contains 10 to 30 atomic percent oxygen.

6. A contact to gallium arsenide comprising:
   a first layer consisting essentially of a gallium oxide compound;

a second layer consisting essentially of a metal element and oxygen;

a third layer comprising nickel, germanium, and gold;

said first layer interposed between said second and third layers; and said third layer contacting said gallium arsenide.

7. A contact to gallium arsenide, as in claim 6 wherein:

said metal element is chosen from the group consisting of nickel and tungsten.

8. A contact to gallium arsenide, as in claim 7 wherein:

said third layer comprises 50 atomic percent nickel, 40 atomic percent germanium, and 10 atomic percent gold.

9. A contact to gallium arsenide, as in claim 8 wherein:

said second layer contains 10 to 30 atomic percent oxygen.

10. A contact to gallium arsenide, as in claim 6 wherein:

said second layer contains 10 to 30 atomic percent oxygen.

* * * * *